United States Patent [19]

Nishikawa et al.

[11] 4,184,130

[45] Jan. 15, 1980

[54] FILTER DEVICES INCORPORATING DIELECTRIC RESONATORS AND LEAKAGE CABLE

[75] Inventors: Toshio Nishikawa, Nagaokakyo; Sadahiro Tamura; Youhei Ishikawa, both of Kyoto; Yoji Ito, Takatsuki, all of Japan

[73] Assignee: Murata Manufacturing Co., Ltd., Kyoto, Japan

[21] Appl. No.: 919,679

[22] Filed: Jun. 27, 1978

[30] Foreign Application Priority Data

Jul. 6, 1977 [JP] Japan .................................. 52/81428

[51] Int. Cl.[2] .......................... H03H 9/00; H01P 7/06

[52] U.S. Cl. .................................... 333/206; 333/202; 333/227

[58] Field of Search ................ 333/73 C, 73 S, 73 W, 333/73 R, 82 R, 83 R, 83 A, 98 R

[56] References Cited

U.S. PATENT DOCUMENTS

| | | | |
|---|---|---|---|
| 3,938,064 | 2/1976 | O'Bryan, Jr. et al. | 333/82 R |
| 3,986,147 | 10/1976 | Carter et al. | 333/73 S |
| 4,019,161 | 4/1977 | Kimura et al. | 333/82 B |
| 4,028,652 | 6/1977 | Wakino et al. | 333/83 R |
| 4,121,181 | 10/1978 | Nishikawa et al. | 333/73 R |

FOREIGN PATENT DOCUMENTS 4613300 5/1971 Japan .................................... 333/73 W

*Primary Examiner*—Alfred E. Smith
*Assistant Examiner*—Harry E. Barlow
*Attorney, Agent, or Firm*—Birch, Stewart, Kolasch & Birch

[57] ABSTRACT

A band rejection coaxial filter for use with a coaxial transmission line, for example, comprises a casing made of a conductive material and having an internal geometry selected to be in a cut off state with respect to the frequency of a signal being transmitted along the coaxial transmission line. The casing is coupled to the coaxial transmission line and a leakage coaxial cable is provided in the casing, so as to be coupled to the coaxial transmission line through the casing. The leakage coaxial cable is formed of a plurality of leakage openings spaced apart from each other a quarter wave length of the resonance frequency of the resonators in the axial direction for allowing for leakage of the transmission signal. A corresponding plurality of dielectric resonators are provided spaced apart a given distance from and faced to the leakage openings, so that a portion of the transmission signal of the frequency determined by the dielectric resonators is trapped.

10 Claims, 14 Drawing Figures

FILTER DEVICES INCORPORATING DIELECTRIC RESONATORS AND LEAKAGE CABLE

BACKGROUND OF THE INVENTION

1. Field of the Invention

The present invention relates to a coaxial filter for use with a transmission line. More specifically, the present invention relates to a coaxial filter, comprising a metallic casing coupled to a transmission line, wherein a dielectric resonator is provided.

2. Description of the Prior Art

A coaxial filter is often required in various types of transmission lines such as a waveguide, coaxial cable, strip line and the like. To that end, the inventors first implemented a coaxial filter of interest to the present invention as shown in FIGS. 1A, 1B and 1C, wherein FIG. 1A shows a plan view of a band rejection coaxial filter for use with a coaxial transmission line with the top plate removed to show the internal structure thereof, FIG. 1B shows a perspective view of a dielectric resonator for use in the FIG. 1A filter and FIG. 1C shows a sectional side view of a portion including a dielectric resonator of the FIG. 1A filter. The filter shown comprises a metallic casing 1 made of aluminum, brass, copper or the like, which is formed of an input opening, not shown, at the left side plate, as viewed, and an output opening, not shown, at the right side plate, as viewed. An input coaxial line 2 is coupled to the input opening by means of an input connector 21 and an output coaxial line 3 is coupled to the output opening by means of an output connector 31. An inner conductor 4 is provided to span the input and output connectors 21 and 30 such that the inner conductor, not shown, of the input coaxial line 2 and the inner conductor, not shown, of the output coaxial line 3 are electrically connected while a characteristic impedance is matched with respect to the casing 1. As a result, the inner conductor of the input coaxial line is connected to the inner conductor of the output coaxial cable 3 through the inner conductor 4.

Three dielectric resonators 5, for example, are disposed in the casing 1 in the vicinity of the inner conductor 4, spaced apart a distance d from the inner conductor 4 and spaced apart from each other a distance commensurate with a quarter wave length or $\tau/4$ of the resonance frequency of the resonators. It is pointed out that the internal geometry of the casing 1 is selected such that the casing 1 exhibits a cut off state with respect to the frequency band to be used. Accordingly, a transmission signal of UHF or SHF transmitted from the input coaxial line 2 is propagated along the inner conductor 4 to the output coaxial line 3 while a portion of the signal of the frequency determined by the above described dielectric resonators 5 is rejected. More specifically, the filter shown constitutes a band rejection filter, wherein a portion of the signal of the frequency determined by the characteristic of the dielectric resonators 5 is trapped by the dielectric resonators 5, whereby the same is prevented from being withdrawn to the output coaxial line 3.

According to such previously implemented coaxial filter as shown in FIGS. 1A, 1B and 1C, it is necessary that the distance from the dielectric resonator 5 to the upper and lower plates 12 and 11 of the casing 1 be sufficiently large enough to avoid any adverse affect, which necessitates a supporting member such as a spacer 6 to support the dielectric resonators 5 in the central position of the inner conductor 4 in the casing 1. Accordingly, the distance H between the upper and lower plates 12 and 11 of the casing and the other geometry are relatively large. Therefore, the inner conductor 4 also must be of a large diameter to achieve an impedance matching with respect to the casing 1. Because of an increased size of the inner conductor 4, some reinforcing means is required to maintain the mechanical strength of the inner conductor 4, with the result that the structure becomes complicated. In addition, a change of the geometry of the casing 1 results in mismatching of the impedance of the inner conductor 4 and accordingly requires readjustment of the impedance matching of the inner conductor 4. Thus, difficulty and complicacy are encountered in actual use of the previously implemented filter.

SUMMARY OF THE INVENTION

Briefly described, the present invention comprises a coaxial filter, wherein a leakage coaxial cable is provided in a metallic casing so as to be coupled to a transmission line, the outer conductor of the leakage coaxial cable is formed of a leakage opening to allow for leakage of a transmission signal through the a leakage opening into the metallic casing and a resonator is provided in the casing to be coupled to the leakage opening. Since a leaked portion of the transmission signal is trapped by the resonator, a band rejection filter is provided.

According to another aspect of the present invention, an output withdrawing means is provided in the casing for receiving signal energy as trapped by the resonator for withdrawing the same as an output. As a result, a bandpass filter is provided.

With such structural feature of the present invention, any particular conductor as required by the previously implemented filter can be dispensed with, inasmuch as the leakage coaxial cable per se may be simply provided in the casing. As a result, the structure is simple and the cost is inexpensive.

Accordingly a principal object of the present invention is to provide an improved coaxial filter, which is simple in structure.

Another object of the present invention is to provide an improved coaxial filter, which is easy to utilize.

A further object of the present invention is to provide an improved coaxial filter, which is inexpensive in cost.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
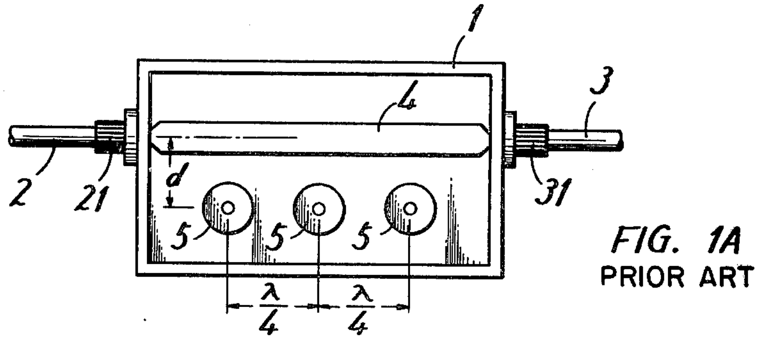
FIG. 1A PRIOR ART
FIGS. 1A, 1B and 1C show an example of a previously implemented band rejection coaxial filter.
Figure 1B:
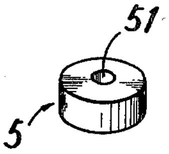
FIG. 1B PRIOR ART
Figure 1C:
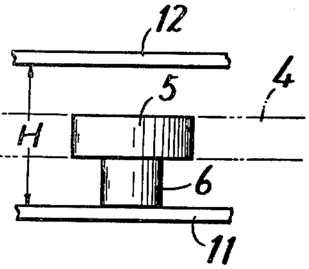
FIG. 1C PRIOR ART
Figure 2:
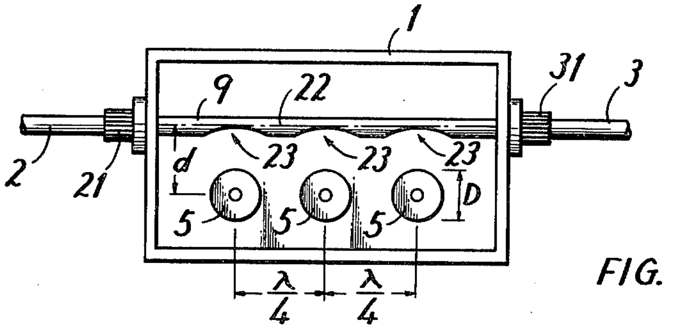
FIG. 2 shows a plan view of one embodiment of the inventive band rejection coaxial filter.

FIG. 2 is a plan view of one embodiment of the inventive band rejection coaxial filter, with the top plate of the casing removed to show the internal structure thereof. Since the major structure of the FIG. 2 embodiment is similar to that of the previously implemented filter, as depicted with reference to FIGS. 1A, 1B and 1C, the same portions have been denoted by the same reference characters, while description thereof is omitted. The FIG. 2 embodiment also comprises a casing 1, as similarly structured. A semirigid leakage coaxial cable 9 is provided in lieu of the inner conductor 4 in the previously implemented filter to span the input and output connectors 21 and 31, so that the semirigid leakage coaxial cable 9 is connected to the input and output coaxial transmission lines 2 and 3 at both ends. The leakage coaxial cable 9 is formed of a plurality of leakage openings 23 spaced apart from each other a distance commensurate with a quarter wave length or λ/4 of the resonance frequency of the resonators 5 to allow for leakage of a portion of the signal being transmitted along the inner conductor 22 of the coaxial cable 9. A corresponding plurality of dielectric resonators 5 are disposed in the casing 1 spaced apart from each other the same distance commensurate with the quarter wave length of the resonance frequency and spaced apart the distance d from the leakage coaxial cable 9. Accordingly, a portion of the signal being transmitted along the leakage coaxial cable as leaked through the leakage openings 23 is trapped by the corresponding dielectric resonators 5, so that the portion of the signal as trapped is prevented from being obtained at the output of the filter.

Figure 4:
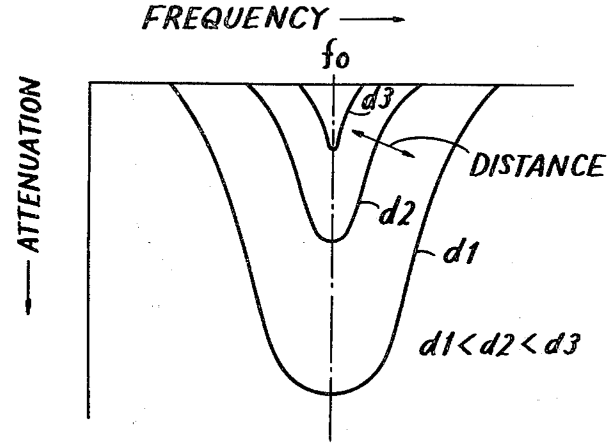
FIG. 4 is a graph showing the attenuation/frequency characteristic of the FIG. 2 filter with the distance between the resonators and the leakage coaxial cable as a parameter.

FIG. 4 is a graph showing the attenuation/frequency characteristic of the FIG. 2 filter, with the distance between the resonators and the leakage coaxial cable as a parameter, wherein the ordinate indicates the attenuation amount and the abscissa indicates the frequency. More specifically, the smaller the distance d the larger the attenuation and the coupling between the leakage coaxial cable 9 and the dielectric resonators 5 and the broader the band width being rejected. Therefore, the distance d between the dielectric resonators 5 and the leakage openings 23 may be adjusted in consideration of a desired band width being rejected and attenuation amount. However, it has been observed that it is not preferred to select the distance d to be larger than one third of the diameter D of the dielectric resonators 5, because an increased distance d causes the dielectric resonators 5 to be adversely affected by the outer conductor of the coaxial transmission line 2, whereby the quality factor Q of the filter is decreased. However, it is needless to say that the distance d may be increased as desired if the band width being rejected and attenuation amount are more important than a decrease of the quality factor Q.

According to the above described embodiment, any particular conductor as required by the previously implemented filter can be dispensed with, inasmuch as the leakage coaxial cable per se may be simply provided in the casing. As a result, the inventive filter is simple in structure, inexpensive in cost and easy to utilize.

Figure 2A:
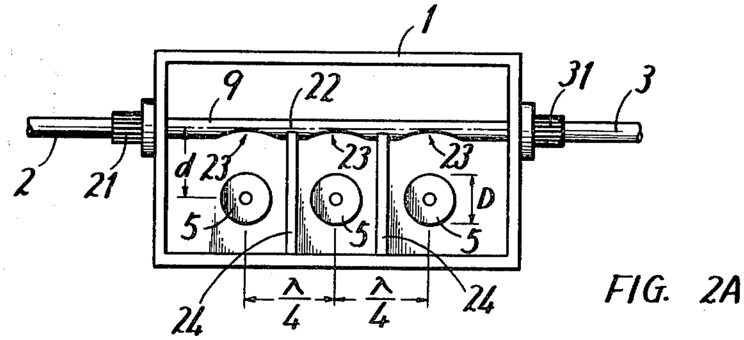
FIG. 2A is similar to FIG. 2 but shows a modification of the FIG. 2 embodiment.

FIG. 2A is similar to FIG. 2 but shows a modification of the FIG. 2 embodiment, wherein shield plates made of metal are provided between two adjacent resonators 5.

Figure 3:
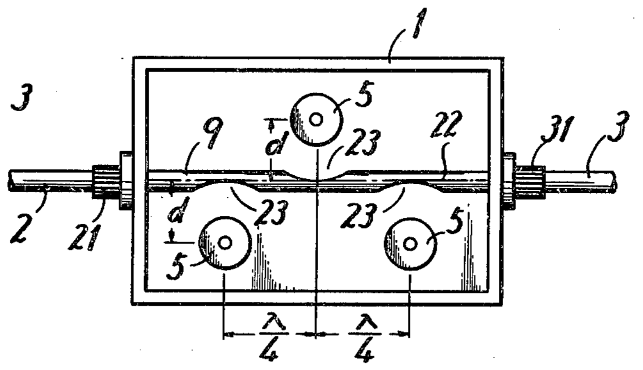
FIG. 3 shows a plan view of another embodiment of the inventive band rejection coaxial filter.

Although in the above described embodiment shown in FIG. 2 a plurality of the dielectric resonators 5 are disposed in the same side of the leakage coaxial cable 9, the dielectric resonators may be disposed alternately at the opposite side of the leakage coaxial cable 9, as shown in FIG. 3, which shows a plan view of another embodiment of the inventive band rejection coaxial filter. As seen in FIG. 3, although the dielectric resonators are disposed alternately at the opposite side of the leakage coaxial cable 9, the distance between two adjacent resonators in the axial direction of the leakage coaxial cable 9 and the distance between each of the resonators and the leakage coaxial cable 9 may be the same as described in the FIG. 2 embodiment. Insofar as the above described distance between any two leakage adjacent dielectric resonators in the axial direction of the leakage coaxial cable 9 and the distance between each of the dielectric resonators and the leakage coaxial cable 9 are left the same, an arrangement of the dielectric resonators with respect to the coaxial leakage cable may be further modified. FIGS. 3A to 3F each show a schematic diagram showing a modified arrangement of the dielectric resonators with respect to the leakage coaxial cable 9, wherein the leakage coaxial cable 9 is simply represented by a solid line and the dielectric resonators are represented by circles.

Although in the foregoing a band rejection filter was shown and described, a bandpass filter can also be implemented in accordance with the present invention. Such an embodiment of a bandpass filter in accordance with the present invention will be described herein below.

Figure 5:
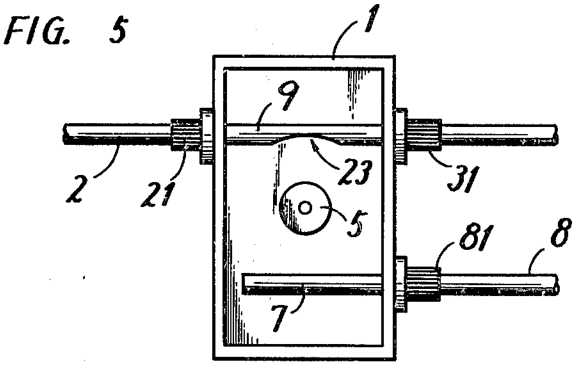
FIG. 5 shows a plan view of a further embodiment of the inventive coaxial filter adapted for simultaneously achieving both a bandpass characteristic and a band rejection characteristic.
Figure 3A:
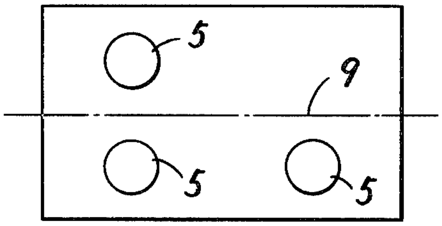
FIGS. 3A to 3F are each a schematic diagram showing a modified arrangement of the dielectric resonators with respect to the leakage coaxial cable.
Figure 3B:
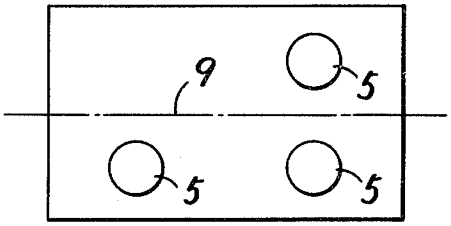
Figure 3C:
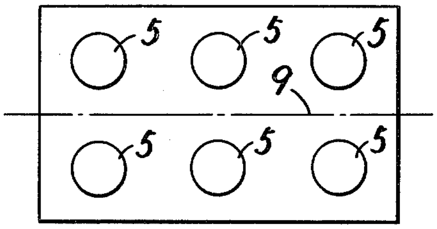
Figure 3D:
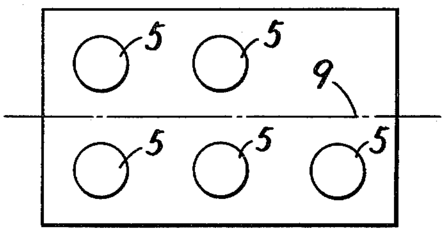
Figure 3E:
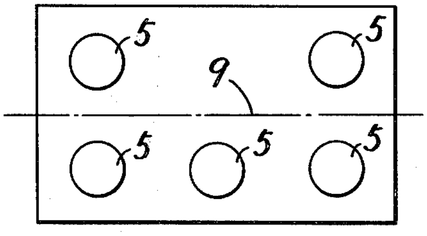
Figure 3F:
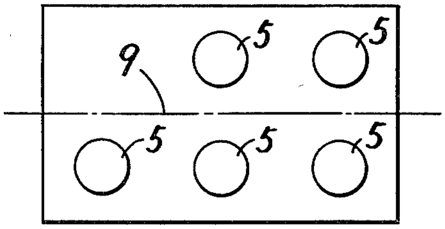

FIG. 5 shows a plan view of a further embodiment of the present invention structured to provide a bandpass coaxial filter, wherein the top plate of the casing has been removed to show the internal structure thereof. Referring to FIG. 5, the leakage coaxial cable 9 is provided through the casing 1 such that the leakage coaxial cable 9 is fixed by means of the input and output connectors 21 and 31. The leakage coaxial cable 9 in the casing 1 is formed of a leakage opening 23 and a dielectric resonator 5 is disposed in the casing 1 so as to be coupled to the leakage opening 23 of the leakage coaxial cable 9. Just at the opposite side of the dielectric resonator 5 as viewed from the leakage coaxial cable 9, a coupling rod 7 of such as a dielectric rod, a conductor rod or the like is provided in the casing 1 so as to serve as an output withdrawing means. The coupling rod 7 is electrically coupled to an output coaxial transmission line 8 through an output connector 81. It should be pointed out that the internal geometry of the casing 1 is selected such that a cut off state is achieved with respect to the frequency being utilized.

In operation, a portion of a signal being transmitted along the leakage coaxial cable 9 is leaked through the leakage opening 23 and is trapped by the dielectric resonator 5. The signal component as trapped by the dielectric resonator 5 is further coupled to the coupling rod 7 and is withdrawn through the coaxial transmission line 8. Accordingly, it would be appreciated that a transmission path from the input coaxial transmission line 2 through the dielectric resonator 5 to the output coaxial transmission line 8 constitute a bandpass filter. Even in the case of the embodiment for implementing a bandpass filter in accordance with the present invention, such filter can be provided by simply providing the leakage coaxial cable 9 in the casing 1, which is formed of the leakage opening 23 and providing the dielectric resonator 5 so as to be coupled to the leakage opening 23, without necessity of any particular separate conductor being provided. Thus, according to the present invention, a bandpass coaxial filter can also be provided, which is simple in structure and inexpensive in cost.

In a preferred embodiment, each resonator for trapping a transmission signal may comprise a dielectric resonator including ceramic such as titanium oxide, which is small sized and inexpensive. Alternatively, however, any other type of resonators or resonance means may be employed, in consideration of a required characteristic geometry, cost and the like. The number of resonators being employed in a filter may be determined as desired in consideration of a required quality factor Q and a band width.

When a plurality of resonators are employed, the resonance frequency of each resonator may be the same in some application but alternatively may be different in other application.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A coaxial filter for use with a transmission line for transmission of a high frequency signal, comprising:

a casing made of a conductive material and defining a space, the internal geometry of said space being selected to be in a cut off state with respect to the frequency of said high frequency signal, a leakage coaxial cable provided in said space of said casing and including an inner conductor and an outer conductor surrounding said inner conductor for transmission of said high frequency signal, said leakage coaxial cable being coupled to said transmission line and having a leakage opening on the outer conductor for allowing for leakage of said high frequency signal, and a resonator provided in said space of said casing and operatively coupled to said leakage opening for trapping said leaked high frequency signal.

2. A coaxial filter for use with a transmission line in accordance with claim 1, wherein at least two leakage openings are formed on the outer conductor of said leakage coaxial cable spaced apart from each other in the axial direction of said leakage coaxial cable, and at least two resonators are provided operatively coupled to said at least two leakage openings.

3. A coaxial filter for use with a transmission line in accordance with claim 2, wherein said at least two leakage openings are formed spaced apart a distance commensurate with a quarter wave length of the resonance frequency of said resonators in the axial direction of said leakage coaxial cable.

4. A coaxial filter for use with a transmission line in accordance with claim 2, wherein said at least two leakage openings are formed spaced apart a given distance in the axial direction of said leakage coaxial cable at the same side of said leakage coaxial cable, and said at least two resonators are provided spaced apart a given distance from and faced to the corresponding leakage openings at the same side with respect to said leakage coaxial cable.

5. A coaxial filter for use with a transmission line in accordance with claim 2, wherein said at least two leakage openings are formed spaced apart a given distance in the axial direction of said leakage coaxial cable and at the opposite sides of said leakage coaxial cable, and said at least two resonators are provided spaced apart a given distance from and faced to the corresponding leakage openings at the opposite sides of said leakage coaxial cable.

6. A coaxial filter for use with a transmission line in accordance with claim 2, wherein said at least two leakage openings are formed in the same position in terms of the axial direction of said leakage coaxial cable and at the opposite sides of said leakage coaxial cable, and said at least two resonators are provided spaced apart a given distance from and faced to the corresponding leakage openings at the opposite sides of said leakage coaxial cable.

7. A coaxial filter for use with a transmission line in accordance with claim 1, wherein said resonator comprises a dielectric resonator.

8. A coaxial filter for use with a transmission line in accordance with claim 1, wherein signal energy of said high frequency signal is trapped by said resonator, whereby said filter serves as a band rejection filter for rejecting the frequency component of said high frequency signal as trapped by said resonator.

9. A coaxial filter for use with a transmission line in accordance with claim 1, which further comprises output withdrawing means provided in said space of said casing for receiving signal energy trapped by said resonator, said filter serving as a band pass filter for allowing selective transmission of signal energy as trapped by said resonator.

10. A coaxial filter for use with a transmission line in accordance with claim 9, wherein said output withdrawing means comprises a conductor member provided spaced apart from said resonator at the opposite side of said resonator from said leakage coaxial cable, a further transmission line being coupled to said conductor member for withdrawing the output.

* * * * *